United States Patent
Zeng

(10) Patent No.: US 8,446,995 B2
(45) Date of Patent: May 21, 2013

(54) METHOD AND DEVICE FOR CORRECTING IQ IMBALANCE OF BASEBAND SIGNALS IN WIRELESS COMMUNICATION RECEIVER

(75) Inventor: Yunbao Zeng, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 342 days.

(21) Appl. No.: 13/041,049

(22) Filed: Mar. 4, 2011

(65) Prior Publication Data

US 2011/0216858 A1 Sep. 8, 2011

(30) Foreign Application Priority Data

Mar. 5, 2010 (CN) .......................... 2010 1 0120015

(51) Int. Cl.
*H04L 27/08* (2006.01)
(52) U.S. Cl.
USPC .......................................................... 375/345
(58) Field of Classification Search
USPC ................ 375/227, 260, 319, 345, 346
See application file for complete search history.

(56) References Cited

U.S. PATENT DOCUMENTS

| | | | |
|---|---|---|---|
| 6,704,551 B2 | 3/2004 | Riou et al. | |
| 6,898,252 B1 | 5/2005 | Yellin et al. | |
| 2005/0276354 A1 | 12/2005 | Su et al. | |
| 2009/0315746 A1* | 12/2009 | Nitsche | 341/120 |
| 2010/0067622 A1* | 3/2010 | Komaili et al. | 375/345 |
| 2010/0232490 A1* | 9/2010 | Balakrishnan et al. | 375/227 |

FOREIGN PATENT DOCUMENTS

| | | |
|---|---|---|
| CN | 1457555 A | 11/2003 |
| CN | 1697432 A | 11/2005 |
| CN | 101499991 A | 8/2009 |
| CN | 101582872 A | 11/2009 |
| WO | 2009/088528 A9 | 7/2009 |
| WO | 2009/124953 A1 | 10/2009 |

OTHER PUBLICATIONS

Francis, Michael "Viterbi Decoder Block Decoding—Trellis Termination and Tail Biting" XILINX Jul. 30, 2011.
Chinese Patent No. 101815056, issued on Sep. 5, 2012, granted in corresponding Chinese Patent Application No. 201010120015.3.

* cited by examiner

*Primary Examiner* — Leon-Viet Nguyen
(74) *Attorney, Agent, or Firm* — Brinks Hofer Gilson & Lione

(57) ABSTRACT

A method and a device for correcting In-phase/Quadrature (IQ) imbalance in baseband signals of a wireless communication receiver are disclosed. The method includes the following: the receiver receives Radio Frequency (RF) signals, and processes the signals to generate In-phase (I) signals and Quadrature (Q) signals; the receiver calculates to obtain an autocorrelation value $E(|I|^2)$ of the I signal, an autocorrelation value $E(|Q|^2)$ of a current Q signal, and a cross-correlation value $E(IQ)$ of the I signal and the current Q signal; the receiver computes $E(|I|^2)$, $(|Q|^2)$ and $E(IQ)$ through arithmetical operations to obtain an estimate value $\hat{A}_n$ of a current amplitude imbalance calibration factor and an estimate value $\hat{P}_n$ of a current phase imbalance calibration factor; and the receiver corrects the current Q signal according to $\hat{A}_n$ and $\hat{P}_n$. The embodiments reduce operations.

10 Claims, 5 Drawing Sheets

METHOD AND DEVICE FOR CORRECTING IQ IMBALANCE OF BASEBAND SIGNALS IN WIRELESS COMMUNICATION RECEIVER

CROSS-REFERENCE TO RELATED APPLICATION

This application claims priority to Chinese Patent Application No. 201010120015.3, filed on Mar. 5, 2010, which is hereby incorporated by reference in its entirety.

FIELD OF THE APPLICATION

The present application relates to signal processing technologies, and in particular, to a method and a device for correcting In-phase/Quadrature (IQ) imbalance of baseband signals in a wireless communication receiver.

BACKGROUND OF THE APPLICATION

In practical Radio Frequency (RF), the phase of an In-phase (I) component is never completely orthogonal to the phase of a Quadrature (Q) component, and the I gain is never exactly the same as the Q gain, which is known as IQ imbalance. The IQ imbalance deteriorates Error Vector Magnitude (EVM). Supposing the amplitude imbalance gain is g and the phase imbalance factor is θ, the theoretic mathematic model of the RF IQ imbalance is:

$$\begin{bmatrix} u_I(k) \\ u_Q(k) \end{bmatrix} = \begin{bmatrix} 1 & 0 \\ -g \times \sin(\theta) & g \times \cos(\theta) \end{bmatrix} \begin{bmatrix} s_I(k) \\ s_Q(k) \end{bmatrix}$$

In the formula above, $s_I(k)$ is the I signal of the baseband signal, $S_Q(k)$ is the Q signal of the baseband signal, $u_I(k)$ is the distorted I signal, and $u_Q(k)$ is the distorted Q signal.

In the prior art, the method for correcting the received I signal and Q signal is roughly below:

1. Calculating $g = \sqrt{2\langle I(t)I(t)\rangle}$.

2. Calculating $\sin(\theta) = \frac{2}{g}\langle I(t)Q(t)\rangle$.

3. Calculating $\cos(\theta) = \sqrt{1-\sin^2(\theta)}$.

4. Calculating 
$$A = \frac{1}{g}$$
$$C = -\frac{\sin(\theta)}{g\cos(\theta)}$$
$$D = \frac{1}{\cos(\theta)}.$$

5. Compensating for the IQ imbalance through:

$$\begin{bmatrix} I'(t) \\ Q'(t) \end{bmatrix} = \begin{bmatrix} A & 0 \\ C & D \end{bmatrix} \begin{bmatrix} I(t) \\ Q(t) \end{bmatrix}$$

In the formula above, $I(t), Q(t)$ are the received uncorrected I signal and Q signal respectively, and $I'(t), Q'(t)$ are the corrected I signal and Q signal respectively.

However, the foregoing calculation method shows that the prior art uses hardware or software to correct the I signals and Q signals in the baseband signals, and that the signal processing involves extraction and computation of trigonometric functions, which results in a huge computation load of the device or software and increases complexity of the device or software.

SUMMARY OF THE APPLICATION

Embodiments provide a method and a device for correcting IQ imbalance of baseband signals in a wireless communication receiver through simpler computation.

An embodiment provides a method for correcting IQ imbalance of baseband signals in a wireless communication receiver, including:

receiving RF signals, by the receiver, and processing the signals to generate an I signal and a Q signal;

calculating to obtain an autocorrelation value $E(|I|^2)$ of the I signal, an autocorrelation value $E(|Q|^2)$ of the current Q signal, and a cross-correlation value $E(IQ)$ of the I signals and the current Q signal;

processing $E(|I|^2)$, $E(|Q|^2)$ and $E(IQ)$ through the following formulae to obtain an estimate value $\hat{A}_n$ of a current amplitude imbalance calibration factor and an estimate value $\hat{P}_n$ of a current phase imbalance calibration factor:

$$\hat{A} = \frac{E(|I|^2) - E(|Q|^2)}{2 \times E(|Q|^2)} \text{ and } \hat{P} = -\frac{(1+A) \times E(IQ)}{E(|I|^2)};$$

and correcting the current Q signal according to $\hat{A}_n$ and $\hat{P}_n$.

An embodiment provides a device for correcting IQ imbalance of baseband signals in a wireless communication receiver, including:

a calculating unit, configured to obtain an I signal and a Q signal from a previous processing circuit, and calculate to obtain an autocorrelation value $E(|I|^2)$ of the I signal, an autocorrelation value $E(|Q|^2)$ of the current Q signal, and a cross-correlation value $E(IQ)$ of the I signals and the current Q signal;

an estimating unit, configured to process $E(|I|^2)$, $E(|Q|^2)$ and $E(IQ)$ through the following formulae to obtain an estimate value $\hat{A}_n$ of a current amplitude imbalance calibration factor and an estimate value $\hat{P}_n$ of a current phase imbalance calibration factor:

$$\hat{A} = \frac{E(|I|^2) - E(|Q|^2)}{2 \times E(|Q|^2)} \text{ and } \hat{P} = -\frac{(1+A) \times E(IQ)}{E(|I|^2)};$$

and a first correcting unit, configured to correct the current Q signal according to $\hat{A}_n$ and $\hat{P}_n$.

The method and device for correcting IQ imbalance according to the embodiments can correct the I signals and Q signals in the baseband signals, improve the orthogonality between the I signal and the Q signal in a simple way, and simplify the relevant software and hardware or systems.

BRIEF DESCRIPTION OF THE DRAWINGS

The following drawings are merely exemplary. Persons of ordinary skill in the art may derive other drawings from such accompanying drawings without departing from the scope of the claims.

DETAILED DESCRIPTION OF THE EMBODIMENTS

To enable a thorough understanding, various embodiments are described below with reference to the accompanying drawings. The embodiments and drawings are merely exemplary and are not intended to limit the scope of the claims.

Figure 1:
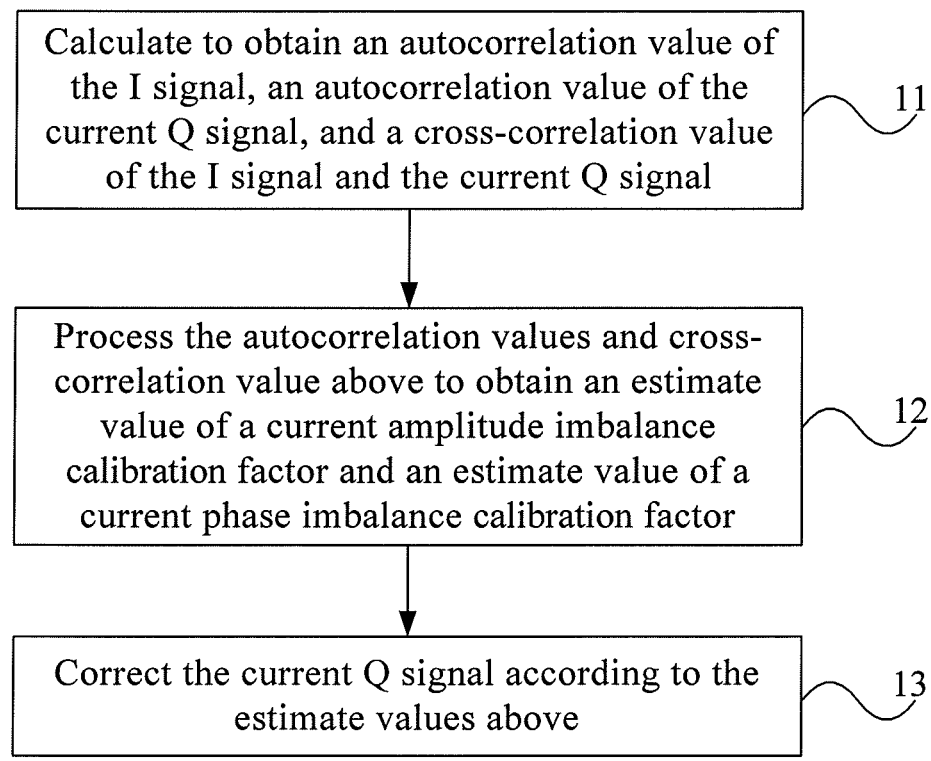
FIG. 1 is a schematic diagram showing the flowchart of a method for correcting IQ imbalance according to a first embodiment.

FIG. 1 is a schematic diagram showing the flowchart of a method for correcting IQ imbalance according to the first embodiment. The method includes:

Step 11: Calculate to obtain an autocorrelation value $E(|I|^2)$ of the I signal, an autocorrelation value $E(|Q|^2)$ of the current Q signal, and a cross-correlation value $E(IQ)$ of the I signal and the current Q signal.

Step 12: Process $E(|I|^2)$ $E(|Q|^2)$ and $E(IQ)$ through the following formulae to obtain an estimate value $\hat{A}_n$ of a current amplitude imbalance calibration factor and an estimate value $\hat{P}_n$ of a current phase imbalance calibration factor:

$$\hat{A} = \frac{E(|I|^2) - E(|Q|^2)}{2 \times E(|Q|^2)} \text{ and } \hat{P} = -\frac{(1+A) \times E(IQ)}{E(|I|^2)}.$$

Step 13: Correct the current Q signal according to $\hat{A}_n$ and $\hat{P}_n$.

The correction formula is: $Q_c{}''=Q_n+(\hat{A}_n Q_n+\hat{P}_n I)$, where $Q_n$ is the current uncorrected Q signal, I is the I signal, and $Q_c{}''$ is the current corrected Q signal.

The method provided in this embodiment can correct the I signals and Q signals in the RF baseband signals, improve the orthogonality between the I signal and the Q signal in a simple way, and simplify the relevant software and hardware or systems. The I signal and Q signal generated after the correction are better orthogonal to each other, and can be output to the specific baseband algorithm module in the wireless receiver to facilitate subsequent processing of the corrected orthogonal signals.

The technical solution under the present embodiment is applicable to the RF receiver in the wireless communication field. The receiver receives RF signals from a signal transmitter first, and processes the received RF signals and analog signals to obtain I signals and Q signals. The receiver corrects the IQ imbalance for the I signals and Q signals through the method of correcting IQ imbalance, and outputs corrected signals. The receiver may be hardware. For example, the hardware for processing the signals may be: A digital logical circuit implements computation of the I signals and Q signals to generate corrected signals, and the digital logical circuit may be integrated in a baseband signal processing chip.

Figure 2:
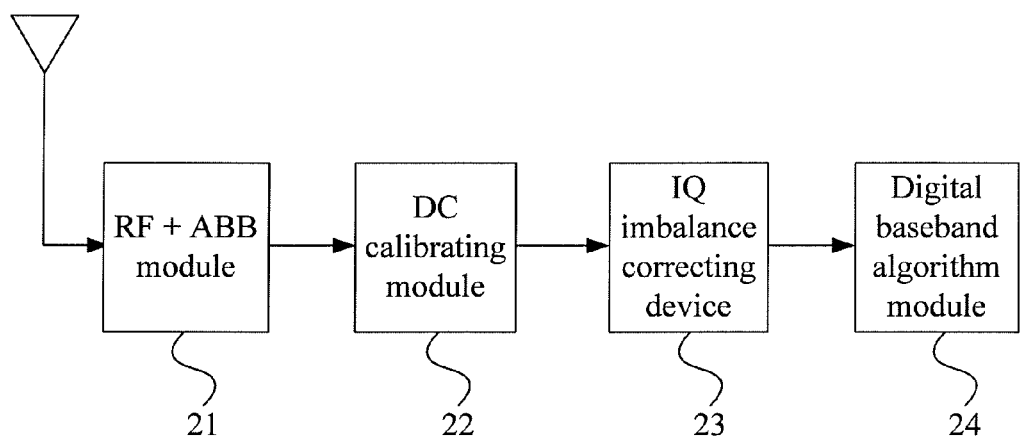
FIG. 2 is a schematic diagram showing a structure of a signal receiving and processing system according to the first embodiment.

FIG. 2 is a schematic diagram showing a structure of a signal receiving and processing system according to the first embodiment. As shown in FIG. 2, the system includes an IQ imbalance correcting device 23 based on the embodiment; an RF+Analog BaseBand (ABB) signal processing module 21 based on the prior art and designed to receive RF signals and perform analog/digital processing; a Direct Current (DC) calibrating module 22 configured to calibrate DC (which is omissible if the RF+ABB module is capable of calibrating DC); and a digital baseband algorithm module 24 configured to process digital baseband signals. The IQ imbalance correcting device will be detailed in the subsequent embodiments. The processing system shown in FIG. 2 is a common processing system among the receivers in the wireless communication field. Persons skilled in the art know that the signals in the receiver may be processed by other means, which are not restricted herein.

Described above is a correction method. To enable better understanding of the embodiments, the following gives the process of deducing the correction method.

Unlike the prior art which uses a trigonometric function to distort the I signals and Q signals, the embodiment provides the following distortion model:

$I=I_0$; and $Q=Q_0+(aQ_0+pI_0)$.

In the formulae above, I, Q are the distorted I signals and Q signals respectively, $I_0$, $Q_0$ are the undistorted I signals and Q signals respectively, a is an amplitude imbalance factor, and p is a phase imbalance factor. For conventional communication signals, the imbalance leads to an amplitude value difference between the I signal and the Q signal, and generates cross-correlation between them.

To correctly obtain undistorted signals from distorted signals, the embodiment provides the following correction model, which enables the corrected signals $I_c$ and $Q_c$ to approach the undistorted signals $I_0, Q_0$:

$I_c=I$; and $Q_c=Q+(AQ+PI)$

In the formulae above, $I_c$ is the corrected I signal, $Q_c$ is the corrected Q signal, I is the received uncorrected I signal, Q is the received uncorrected Q signal, A is an amplitude imbalance calibration factor, and P is a phase imbalance calibration factor.

Supposing the I signals and Q signals are received in a random process and have additive noise and the modulation mode of the signals is unknown, according to the characteristics of the $I_c$ signals and $Q_c$ signals, the imbalance calibration factors A and P in the foregoing correction formulae can be obtained in the following way:

The system fulfills:

$E(|I_c|^2)=E(|Q_c|^2)$ $E(I_c Q_c)=0$

In the formulae above, $E(|I_c|^2)$ is a statistic average power value of the I signals, namely, an autocorrelation value of the I signals; $E(|Q_c|^2)$ is a statistic average power value of the Q signals, namely, an autocorrelation value of the Q signals; and $E(I_c Q_c)$ is a cross-correlation value of the I signals and Q signals, namely, a sum of the dot product of I signals and the dot product of Q signals.

From the correction model and the characteristics of the $I_c$ signals and $Q_c$ signals, it is deduced that:

$$E(|I|^2)=E(|(1+A)Q+PI|^2)=(1+A)^2E(|Q|^2)+2P(1+A)E(IQ)+P^2E(|I|^2)(1+2A+A^2)E(|Q|^2)=(1-P^2)E(|I|^2)-2P(1+A)E(IQ)$$

Because the imbalance factor is generally very small, namely, $A^2 \ll 1$, $P^2 \ll 1$ and $E(|I|^2) \gg P \cdot E(IQ)$, $$(1+2A)E(|Q|^2) \approx E(|I|^2); \text{ and}$$

$$A \approx \frac{E(|I|^2 - E(|Q|^2))}{2E(|Q|^2)}.$$

From the characteristics of the $I_c$ signals and $Q_c$ signals, it is deduced that:

$$E(I(Q + AQ + PI)) = 0;$$

$$(1+A)E(IQ) + P \cdot E(|I|^2) = 0; \text{ and}$$

$$P = -\frac{(1+A)E(IQ)}{E(|I|^2)}.$$

After A and P are obtained, the received signals can be corrected, namely, the correction procedure described in the first embodiment is implemented. The foregoing correction formulae show that the I signals involve no distortion. Therefore, in the second embodiment, the Q signals are corrected, and the received I signals are directly used as corrected I signals.

Figure 3:
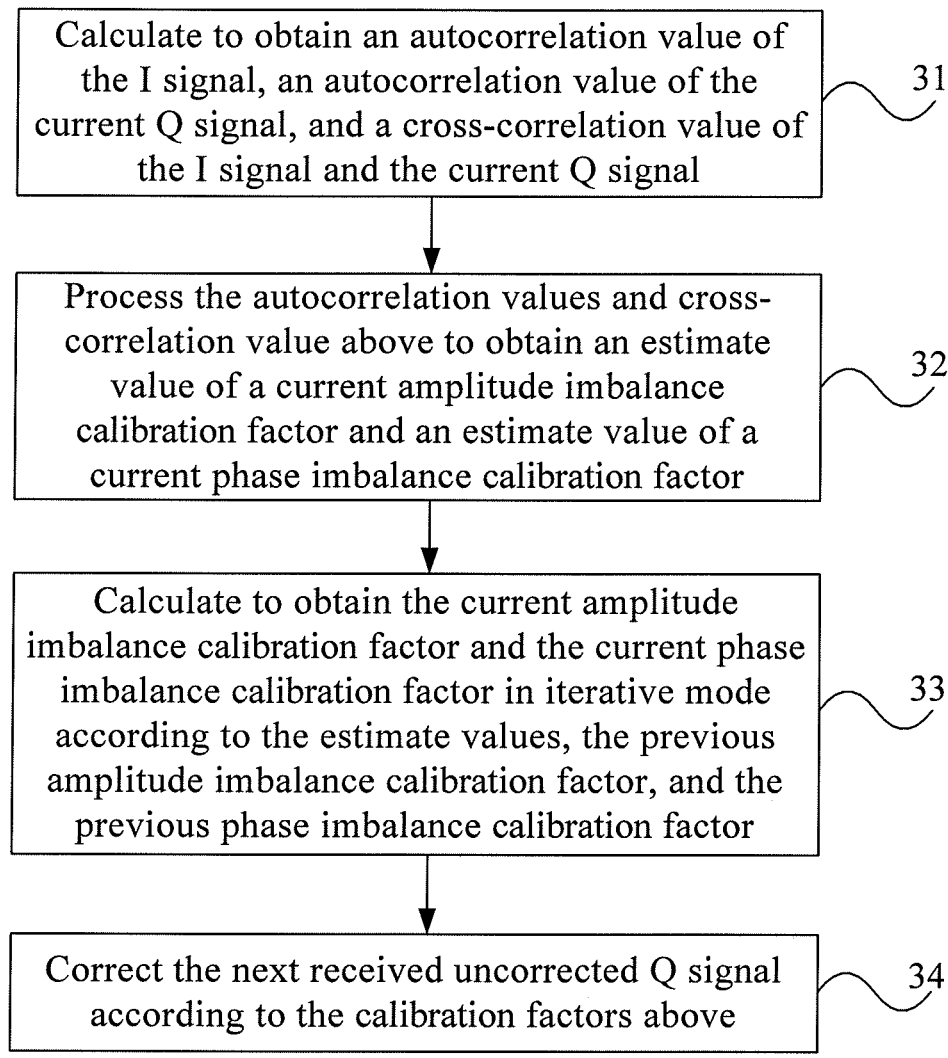
FIG. 3 is a schematic diagram showing the flowchart of a method for correcting IQ imbalance according to a second embodiment.
Figure 4:
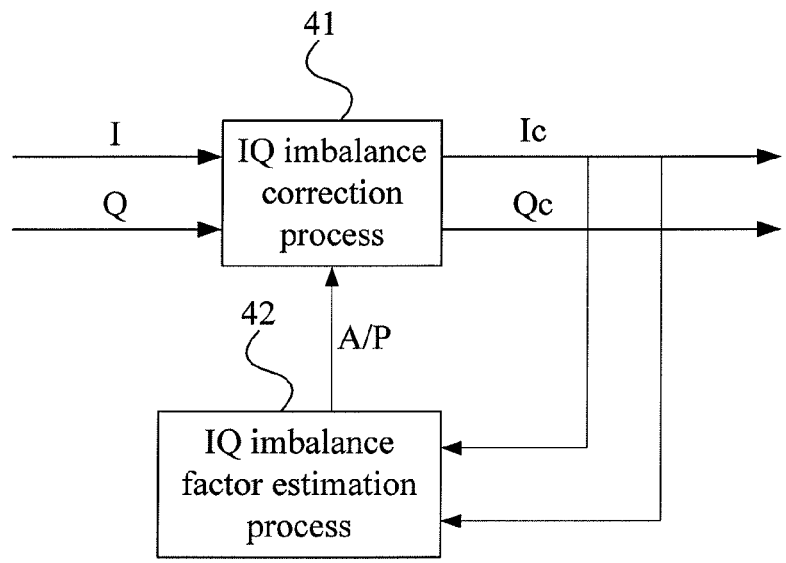
FIG. 4 is a schematic diagram illustrating the second embodiment.
Figure 5:
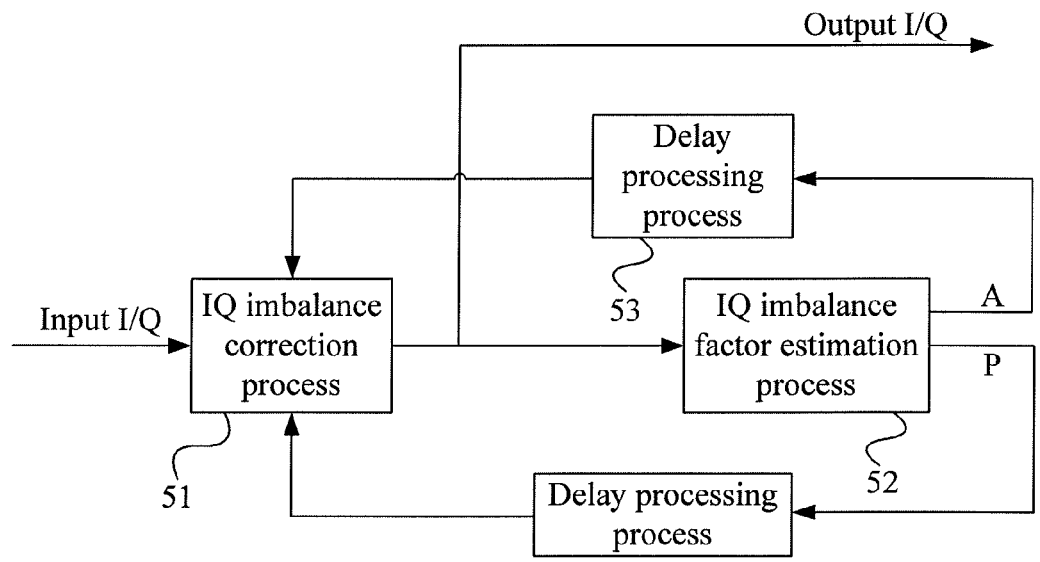
FIG. 5 is another schematic diagram illustrating the second embodiment.

Because the calculation of A and P ignores second-order imbalance, the imbalance calibration factor may be calculated through iteration, as detailed below:

FIG. 3 is a schematic diagram showing a flowchart of a method for correcting IQ imbalance according to the second embodiment. FIG. 4 is a schematic diagram illustrating the second embodiment. FIG. 5 is another schematic diagram illustrating the second embodiment. As shown in FIG. 4, in the IQ imbalance correction process 41 and the IQ imbalance factor estimation process 42, the received I signals and Q signals undergo correction compensation iteratively. The input data streams are uncorrected I signals (I) and uncorrected Q signals (Q); the input parameters are imbalance calibration factors A and P which are obtained by calculating; the output data streams are corrected I signals (Ic) and corrected Q signals (Qc), where Ic and Qc may be used to calculate A and P. The process of calculating A and P is detailed in FIG. 5. Compared with FIG. 4, FIG. 5 shows more details and includes: an IQ imbalance correction process 51, an IQ imbalance factor estimation process 52, and a delay processing process 53. The delay processing process 53 can delay outputting the currently obtained imbalance calibration factors A and P to the next subframe, with a view to calculating the imbalance calibration factor corresponding to the next subframe. The delay processing process in FIG. 5 may delay the output for one subframe or N subframes before a correction compensation process is performed. The iterative solution for correcting imbalance lowers the requirement on precision of every calculation.

As shown in FIG. 3, the process in this embodiment includes the following steps:

Step 31: Calculate to obtain an autocorrelation value $E(|I|^2)$ of the I signal, an autocorrelation value $E(|Q|^2)$ of the current Q signal, and a cross-correlation value $E(IQ)$ of the I signal and the current Q signal.

Step 32: Process $E(|I|^2)$, $E(|Q|^2)$ and $E(IQ)$ to obtain an estimate value $\hat{A}_n$ of a current amplitude imbalance calibration factor and an estimate value $\hat{P}_n$ of a current phase imbalance calibration factor.

More details of the steps 31-32 can be seen in the steps 11-12 above.

Step 33: Calculate to obtain the current amplitude imbalance calibration factor $A_n$ and the current phase imbalance calibration factor $P_n$ in iterative mode according to $\hat{A}_n, \hat{P}_n$, the previous amplitude imbalance calibration factor $A_{n-1}$, and the previous phase imbalance calibration factor $P_{n-1}$.

The formulae may be:

$$A_n = A_{n-1} + \text{weight} \times \hat{A}_n; \text{ and}$$

$$P_n = P_{n-1} + \text{weight} \times \hat{P}_n.$$

In the formulae above, weight is a weighting coefficient, and the initial value of both $A_{n-1}$ and $P_{n-1}$ is 0. The weight is in proportion to the correction residual. The correction residual is the difference between the signal value obtained after correction and the signal value before distortion, namely, the difference between the corrected value and the true value. For a greater correction residual, the weighting coefficient may be greater; for a smaller correction residual, the weighting coefficient may be smaller. Because the correction residual is great at the beginning, a great weighting coefficient may be applied at the beginning. For example, the weighting coefficient is 0.25 for the first 10 occasions, and is 0.05 for the following 10 occasions.

Step 34: Correct the next uncorrected Q signal according to $A_n$ and $P_n$.

For example, calculate to obtain the current amplitude imbalance calibration factor $A_n$ and the current phase imbalance calibration factor $P_n$ according to $\hat{A}_n$ and $\hat{P}_n$, and then use $A_n$ and $P_n$ to compensate for the received signals. The correction formula is: $Q_c^{n+1} = Q_{n+1}(A_n \times Q_{n+1} + P_n \times I)$, where $Q_{n+1}$ is the next uncorrected Q signal, I is the I signal, and $Q_c^{n+1}$ is the next corrected Q signal.

The signal processing process in this embodiment may be implemented by software or hardware simply, without involving extraction of a root or computation of a trigonometric function. In this embodiment, the imbalance calibration factor undergoes iterative computation to generate further corrected signals, thus improving the correction precision and preventing the residual IQ imbalance from affecting the demodulation performance.

Figure 6:
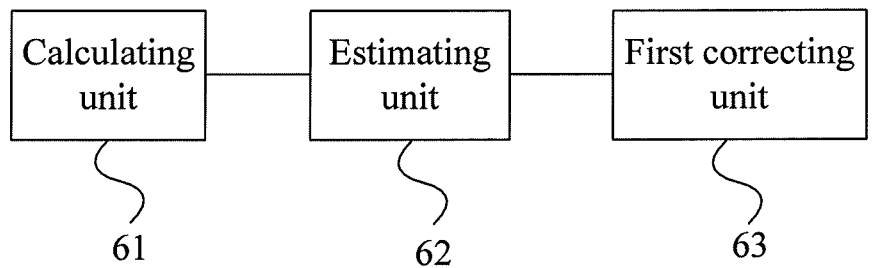
FIG. 6 is a schematic diagram showing a structure of a device for correcting IQ imbalance according to a third embodiment.

FIG. 6 shows a structure of a device for correcting IQ imbalance according to the third embodiment. The device includes: a calculating unit 61, configured to obtain an I signal and a Q signal from a previous processing circuit, and calculate to obtain an autocorrelation value $E(|I|^2)$ of the I signal, an autocorrelation value $E(|Q|^2)$ of the current Q signal, and a cross-correlation value $E(IQ)$ of the I signal and the current Q signal; an estimating unit 62, configured to process $E(|I|^2)$, $E(|Q|^2)$ and $E(IQ)$ through the following formulae to obtain an estimate value $\hat{A}_n$ of a current amplitude imbalance calibration factor and an estimate value $\hat{P}_n$ of a current phase imbalance calibration factor:

$$\hat{A} = \frac{E(|I|^2) - E(|Q|^2)}{2 \times E(|Q|^2)} \text{ and } \hat{P} = -\frac{(1+A) \times E(IQ)}{E(|I|^2)};$$

and a first correcting unit 63, configured to correct the current Q signal according to $\hat{A}_n$ and $\hat{P}_n$.

The first correcting unit may be configured to use the correction formula $Q_c^n = Q_n + (\hat{A}_n Q_n + \hat{P}_n I)$ to correct the current Q signal and obtain the corrected Q signal, where $Q_n$ is the current uncorrected Q signal, I is the I signal, and $Q_c''$ is the current corrected Q signal.

For the detailed functions of the foregoing units, reference can be made to the method embodiment above, and thus the functions of the foregoing units are not repeatedly described here.

The IQ imbalance correcting device may be realized through an Integrated Circuit (IC). The digital logical circuits integrated in the baseband signal processing chip perform logical operations to correct the I signal and Q signal and improve the orthogonality. The corresponding device executes simple signal processing methods and does not need to extract a root or compute a trigonometric function, thus simplifying the design of the baseband processing chip.

Figure 7:
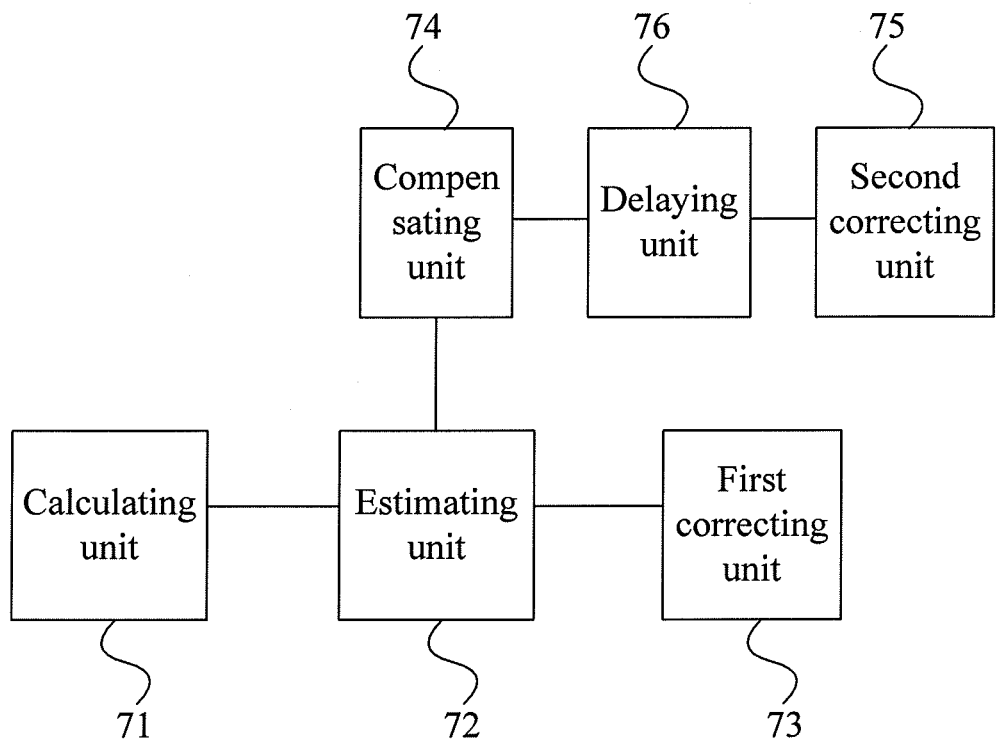
FIG. 7 is a schematic diagram showing a structure of a device for correcting IQ imbalance according to a fourth embodiment.

FIG. 7 shows a structure of a device for correcting IQ imbalance according to the fourth embodiment. The device includes a calculating unit 71, an estimating unit 72, a first correcting unit 73, a compensating unit 74, and a second correcting unit 75. For detailed functions of the calculating unit 71, estimating unit 72 and first correcting unit 73, reference can be made to the third embodiment above. The compensating unit 74 is configured to use an amplitude imbalance calibration factor and a phase imbalance calibration factor generated in at least one correction before the current correction, to correct $\hat{A}_n$ and $\hat{P}_n$, and obtain the current amplitude imbalance calibration factor $A_n$ and the current phase imbalance calibration factor $P_n$; and the second correcting unit 75 is configured to use $A_n$ and $P_n$ to correct the next uncorrected Q signal and obtain the next corrected Q signal $Q_c^{n+1} = Q_{n+1} + (A_n \times Q_{n+1} + P_n \times I)$, where $Q_{n+1}$ is the next uncorrected Q signal, I is the I signal, and $Q_c^{n+1}$ is the next corrected Q signal.

The compensating unit 74 is configured to use the following formulae to perform iterative computation and obtain $A_n$ and $P_n$:

$$A_n = A_{n-1} + \text{weight} \times \hat{A}_n; \text{ and}$$

$$P_n = P_{n-1} + \text{weight} \times \hat{P}_n.$$

In the formulae above, weight is a weighting coefficient, $A_{n-1}$ is the amplitude imbalance calibration factor in the previous correction, $P_{n-1}$ is the phase imbalance calibration factor in the previous correction, and the initial value of both $A_{n-1}$ and $P_{n-1}$ is 0.

Further, the device in this embodiment may further include a delaying unit 76, which is configured to delay outputting $A_n$ and $P_n$ generated by the compensating unit 74, and send the delayed $A_n$ and $P_n$ to the second correcting unit 75 as an input of the next iterative computation.

The device in this embodiment involves no extraction of a root or computation of a trigonometric function. Therefore, when the computation is implemented through hardware such as an IC, the circuit structure is simplified and the computation is simplified. In this embodiment, the imbalance calibration factor undergoes iterative computation to improve the correction precision, prevent the residual IQ imbalance from affecting the demodulation performance, and simplify the relevant software and hardware or system. The IQ imbalance correcting device is applicable in a receiver of a wireless communication system. As shown in FIG. 2, after the signals received in the receiver undergo RF and analog baseband signal processing and DC calibration, the signals may be corrected in the method provided in the embodiments to improve the orthogonality between the I signals and Q signals.

In conclusion, in the embodiments, the computation of the imbalance calibration factor involves operations of multiplying, adding and dividing only, but involves no extraction of a root, thus simplifying the computation. The correction involves only two multiplying operations and one adding operation, and therefore is simpler than the prior art which involves three multiplying operations and one adding operation. The method and device provided herein lower the requirements on software and hardware, and reduce the complexity of design of the baseband processing chip.

Persons of ordinary skill in the art should understand that all or part of the steps of the method according to the embodiments may be implemented by a program instructing relevant hardware. The program may be stored in a computer readable storage medium. When the program runs, the steps of the method according to the embodiments are performed. The storage medium may be any medium that is capable of storing program codes, such as a Read Only Memory (ROM), a Random Access Memory (RAM), a magnetic disk, or a Compact Disk-Read Only Memory (CD-ROM).

Finally, it should be noted that the above embodiments are merely provided for describing the technical solution, and are not intended to limit the scope of the claims. It is apparent that persons skilled in the art can make various modifications and variations to the disclosed embodiments and that such modifications will fall within the scope of protection defined by the following claims and their equivalents.

What is claimed is:

1. A method for correcting In-phase/Quadrature (IQ) imbalance of baseband signals in a wireless communication receiver, comprising:

receiving, by the receiver, Radio Frequency (RF) signals, and processing the signals to generate an In-phase (I) signal and a Quadrature (Q) signal;

calculating an autocorrelation value $E(|I|^2)$ of the I signal, an autocorrelation value $E(|Q|^2)$ of the Q signal, and a cross-correlation value $E(IQ)$ of the I signal and the Q signal;

calculating an estimate value $\hat{A}_n$ of a current amplitude imbalance calibration factor and an estimate value $\hat{P}_n$ of a current phase imbalance calibration factor as follows:

$$\hat{A} = \frac{E(|I|^2) - E(|Q|^2)}{2 \times E(|Q|^2)} \text{ and } \hat{P} = -\frac{(1+\hat{A}) \times E(IQ)}{E(|I|^2)};$$

and
   correcting the Q signal according to the $\hat{A}_n$ and $\hat{P}_n$.

2. The method according to claim 1, wherein:
   correcting the Q signal according to the $\hat{A}_n$ and $\hat{P}_n$ comprises:
   obtaining a corrected Q signal $Q_c''$ as follows:

$$Q_c'' = Q_n + (\hat{A}_n Q_n + \hat{P}_n I),$$

wherein the $Q_n$ is the Q signal, I is the I signal.

3. The method according to claim 1, wherein:
   correcting the Q signal according to the $\hat{A}_n$ and $\hat{P}_n$ comprises performing iterative correction to the Q signal according to the $\hat{A}_n$ and $\hat{P}_n$, wherein performing iterative correction to the Q signal according to the $\hat{A}_n$ and $\hat{P}_n$ comprises:
   correcting the $\hat{A}_n$ and $\hat{P}_n$ by using another amplitude imbalance calibration factor and another phase imbalance calibration factor generated in at least one former correction, and obtaining a current amplitude imbalance calibration factor $A_n$ and a current phase imbalance calibration factor $P_n$;

correcting a former corrected Q signal by using the $A_n$ and $P_n$; and obtaining a next corrected Q signal $Q_c^{n+1}$ as follows:

$$Q_c^{n+1} = Q_{n+1} + (A_n \times Q_{n+1} + P_n \times I),$$

wherein the $Q_{n+1}$ is the former corrected Q signal, I is the I signal.

4. The method according to claim 3, wherein:

correcting the $\hat{A}_n$ and $\hat{P}_n$ by using another amplitude imbalance calibration factor and another phase imbalance calibration factor generated in at least one former correction, and obtaining a current amplitude imbalance calibration factor $A_n$ and a current phase imbalance calibration factor $P_n$ comprises:

performing iterative computation to calculate the $A_n$ and $P_n$ as follows:

$$A_n = A_{n-1} + \text{weight} \times \hat{A}_n; \text{ and}$$

$$P_n = P_{n-1} + \text{weight} \times \hat{P}_n;$$

wherein weight is a weighting coefficient, $A_{n-1}$ is said another amplitude imbalance calibration factor, and $P_{n-1}$ is said another phase imbalance calibration factor.

5. The method according to claim 4, wherein:

in the iterative correction, a value of the weighting coefficient in at least one correction is smaller than another value of the weighting coefficient in a correction before the at least one correction.

6. A device for correcting In-phase/Quadrature (IQ) imbalance of baseband signals in a wireless communication receiver, comprising:

a calculating unit configured to obtain an In-phase (I) signal and a Quadrature (Q) signal from a previous processing circuit, and calculate an autocorrelation value $E(|I|^2)$ of the I signal, an autocorrelation value $E(|Q|^2)$ of the Q signal, and a cross-correlation value $E(IQ)$ of the I signal and the Q signal;

an estimating unit configured to calculate an estimate value $\hat{A}_n$ of a current amplitude imbalance calibration factor and an estimate value $\hat{P}_n$ of a current phase imbalance calibration factor as follows:

$$\hat{A} = \frac{E(|I|^2) - E(|Q|^2)}{2 \times E(|Q|^2)} \text{ and } \hat{P} = -\frac{(1+\hat{A}) \times E(IQ)}{E(|I|^2)};$$

and a first correcting unit configured to correct the Q signal according to the $\hat{A}_n$ and $\hat{P}_n$.

7. The device according to claim 6, wherein:

the first correcting unit is configured to obtain a corrected Q signal $Q_c^n$ as follows:

$$Q_c^n = Q_n + (\hat{A}_n Q_n + \hat{P}_n I),$$

wherein $Q_n$ is the Q signal and I is the I signal.

8. The device according to claim 6, further comprising:

a compensating unit configured to correct the $\hat{A}_n$ and $\hat{P}_n$ by using another amplitude imbalance calibration factor and another phase imbalance calibration factor generated in at least one former correction, and obtain a current amplitude imbalance calibration factor $A_n$ and a current phase imbalance calibration factor $P_n$; and a second correcting unit configured to correct a former corrected Q signal by using the $A_n$ and $P_n$, and to calculate a next corrected Q signal $Q_c^{n+1}$ as follows:

$$Q_c^{n+1} = Q_{n+1} + (A_n \times Q_{n+1} + P_n \times I),$$

wherein the $Q_{n+1}$ is the former corrected Q signal and I is the I signal.

9. The device according to claim 8, wherein:

the compensating unit is configured to perform iterative computation to calculate $A_n$ and $P_n$ as follows:

$$A_n = A_{n-1} + \text{weight} \times \hat{A}_n; \text{ and}$$

$$P_n = P_{n-1} + \text{weight} \times \hat{P}_n;$$

wherein weight is a weighting coefficient, $A_{n-1}$ is said another amplitude imbalance calibration factor, and $P_{n-1}$ is said another phase imbalance calibration factor.

10. The device according to claim 9, further comprising:

a delaying unit configured to delay outputting the $A_n$ and $P_n$ generated by the compensating unit, and send the delayed $A_n$ and $P_n$ to the second correcting unit as an input of a next iterative computation.

* * * * *